United States Patent
Popescu

(10) Patent No.: US 10,578,700 B2
(45) Date of Patent: Mar. 3, 2020

(54) METHOD AND APPARATUS FOR RECONSTRUCTION OF MAGNETIC RESONANCE IMAGES WITH INCOMPLETE SAMPLING

(71) Applicant: Siemens Healthcare GmbH, Erlangen (DE)

(72) Inventor: Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 427 days.

(21) Appl. No.: 15/637,147

(22) Filed: Jun. 29, 2017

(65) Prior Publication Data

US 2018/0003790 A1 Jan. 4, 2018

(30) Foreign Application Priority Data

Jul. 4, 2016 (DE) .................. 10 2016 212 098

(51) Int. Cl.
*G01R 33/56* (2006.01)
*G01R 33/48* (2006.01)
*G06T 11/00* (2006.01)
*G01R 33/561* (2006.01)
*G01R 33/24* (2006.01)

(52) U.S. Cl.
CPC ....... *G01R 33/5608* (2013.01); *G01R 33/482* (2013.01); *G01R 33/4822* (2013.01); *G01R 33/5611* (2013.01); *G06T 11/003* (2013.01); *G01R 33/246* (2013.01); *G01R 33/4816* (2013.01); *G06T 2207/10016* (2013.01)

(58) Field of Classification Search
CPC .............. G01R 33/246; G01R 33/4816; G01R 33/482; G01R 33/4822; G01R 33/5608; G01R 33/5611; G06T 11/003; G06T 2207/10016
See application file for complete search history.

(56) References Cited

U.S. PATENT DOCUMENTS

2002/0175683 A1 11/2002 Mertelmeier et al.
2008/0012562 A1 1/2008 Beatty
(Continued)

OTHER PUBLICATIONS

Pruessmann et al.: "SENSE: Sensitivity Encoding for Fast MRI", in: Magnetic Resonance in Medicine, vol. 42. pp. 952-962; (1999).
(Continued)

*Primary Examiner* — Michael T Rozanski
(74) *Attorney, Agent, or Firm* — Schiff Hardin LLP

(57) ABSTRACT

A magnetic resonance (MR) image is created by executing an imaging sequence with an MR apparatus, wherein data in k-space are acquired using multiple receiving antennae, and reconstruction of all image points that correspond to all k-space points belonging to the imaging sequence takes place using a sensitivity profile of the receiving antennae in order to also take account of data at k-space points at positions at which no data were acquired. Data acquired at a number of positions of particular k-space points, the number of the particular k-space points being smaller than the number of all k-space points belonging to the imaging sequence. The aperture of each of the receiving antennae is configured such that, for acquisition of data at a respective k-space point, the spectral main lobe of the respective receiving antenna also extends over k-space points adjacent to the respective k-space point.

22 Claims, 6 Drawing Sheets

(56) References Cited

U.S. PATENT DOCUMENTS

| | | |
|---|---|---|
| 2009/0115413 A1 | 5/2009 | Senegas et al. |
| 2012/0074938 A1 | 3/2012 | Grodzki et al. |
| 2014/0117986 A1 | 5/2014 | Grodzki |
| 2016/0245882 A1 | 8/2016 | Popescu |

OTHER PUBLICATIONS

Wiesinger et al., "Zero TE MR Bone Imaging in the Head", Magnetic Resonance in Medicine vol. 75: pp. 107-114; (2016).

Samsonov, et al.:"Advances in Locally Constrained k-Space-Based Parallel MRI"; Magnetic Resonance in Medicine; vol. 55; pp. 431-438; (2006).

Yeh, et al.: "3Parallel Magnetic Resonance Imaging with Adaptive Radius in k-Space (PARS): Constrained Image Reconstruction using k-Space Locality in Radiofrequency Coil Encoded Data"; Magnetic Resonance in Medicine; vol. 53; pp. 1383-1392; (2005).

Samsonov, "On Optimality of Parallel MRI Reconstruction in k-Space"; Magnetic Resonance in Medicine; vol. 59; pp. 156-164; (2008).

METHOD AND APPARATUS FOR RECONSTRUCTION OF MAGNETIC RESONANCE IMAGES WITH INCOMPLETE SAMPLING

BACKGROUND OF THE INVENTION

Field of the Invention

The present invention concerns the reconstruction of magnetic resonance (MR) images with incomplete sampling (acquisition of raw MR data entered into k-space) and the determination of an aperture of a receiving antenna of the MR scanner in order to enable such reconstruction.

Description of the Prior Art and Related Subject Matter

The MR imaging of solid (hard or semi-hard) tissue, for example, cortical bone, cancellous bone, a tooth or a meniscus, a tendon or a ligament, is not possible with conventional MR methods. MR signals from such tissue must be acquired in a time span of less than 100 µs, which is barely achievable with modern MR sequences. However, since the imaging of such tissue is highly relevant, particularly for clinical MR imaging, specific devices and new MR sequences and reconstruction methods have recently been developed in order also to make this type of tissue visible with MR imaging. The best of such methods are generally known as ZTE ("zero echo time") or UTE ("ultrashort echo time") MR methods.

The imaging of a tissue with very short T1 and T2 relaxation times represents a great challenge for a magnetic resonance data acquisition scanner. Since the MR signal decays exponentially, the signal detection must take place immediately following excitation. However, due to the dead time of a conventional magnetic resonance scanner, this is not possible. The dead time is a period of time that the magnetic resonance scanner requires to switch from transmission operation (TX) to receiving operation (RX). During the dead time, the RF energy stored in the transmitting coil must be substantially eliminated and the receiving coils must be adjusted for signal detection. In most clinical magnetic resonance systems, this dead time is in the range from 40 to 100 µs. When special hardware is used, a dead time of only 8 µs has been observed in clinical magnetic resonance systems. However, operation with such a short dead time compromises reliable operation of the receiving coils and involves tolerating inherent limitations on the level of the RF output that is used for imaging.

Since the ZTE and UTE MR methods normally acquire the MR data on the basis of radial trajectories (i.e. the path in k-space along which the acquired raw data are entered into k-space), even at short dead times, the data are not acquired specifically in the region of the k-space center. The lack of data from the region of the k-space center represents a serious problem for the reconstruction, since the data from the region of the k-space center are responsible for the correct contrast of the reconstructed MR image. In other words, an incorrect assumption (estimation or derivation) of the values for the non-acquired data in the region of the k-space center (for example by extrapolation or filling with zeros ("zero filling")) leads to severe image artifacts or undesirable contrast levels.

A further problem with the acquisition of MR data of a tissue with a very short T2 time is the rapid decay of the MR signal to be acquired. A short T2 time means that the transverse magnetization of the tissue very rapidly dephases, so that the acquired MR signals are soon no longer distinguishable from noise. Therefore, these acquired noise-containing MR signals impair the result of the reconstructed MR images, so that fine anatomical details remain hidden and the image quality is reduced.

The above-described problems in the prior art will now be described in more detail with reference to FIG. 1.

In FIG. 1, a ZTE or UTE MR sequence is shown at left. With the sequence shown, k-space 50 is scanned (filled with acquired data) radially, as represented in FIG. 1 at right.

Before an RF excitation pulse 41 is radiated, the gradients 42 are ramped up, with which the trajectory 55 is determined along which data from the k-space points 54 are acquired. Due to the unavoidable dead time 43, no data can be acquired in the region of the k-space center 51. Following the dead time 43, during the readout time 44, only part of the FID signal 45 is acquired. The data of the FID signal 45 that are acquired during the "dwell time" (i.e. the readout time for a k-space point 54) herein constitutes the data for a k-space point. Apart from the region of k-space 50 in the center of k-space denoted with the reference numeral 51, there exist a k-space region 52 and a k-space region 53. While the k-space region 53 lies at the edge of k-space, the k-space region 52 lies between the k-space region 51 in the k-space center and the k-space region 53 at the edge of k-space. As mentioned above, the data of the k-space points lying in the k-space region 53 is already noise-infested since the FID signal 45 has already decayed greatly (which for illustrative reasons could not be shown in FIG. 1).

SUMMARY OF THE INVENTION

An object of the present invention, starting from an incomplete and/or noise-laden data acquisition in k-space, is to nevertheless reconstruct MR images with good image quality.

In accordance with the present invention, a method for creating an MR image by using an imaging sequence to operate an MR data acquisition scanner of a magnetic resonance apparatus includes the following steps.

In a first step, acquisition of data in k-space takes place with multiple receiving antennae of the magnetic resonance scanner. The data are acquired only at particular (and not all) k-space points. In other words, the data are not acquired at all the k-space points defined by the imaging sequence, so that k-space is incompletely sampled.

In MR imaging, the acquisition of the data takes place directly in k-space, which corresponds to the volume portion from which MR images are to be created. The acquisition of discrete sampling values of k-space data typically takes place in successive packages of many k-space sampling values, which are acquired in a temporal sequence along a single trajectory. The trajectories can extend in straight lines, wherein successive trajectories extend, in the Cartesian case, parallel in k-space or, with a radial data acquisition, radially through the k-space center.

For the acquisition of k-space points along a trajectory, the MR signal is encoded with respect of its phase and frequency by linear gradients, so that for each sampling value that is detected by the respective receiving antenna, a mathematical convolution in the spectral domain between k-space of the examination object and a convolution kernel that corresponds to the spectral footprint of the respective receiving antenna can be imagined (see equation (1)). The final result is that for each measured sampling value, the convolution kernel (in particular the maximum amplitude of the spectral footprint of the respective receiving antenna) is centered on the current sampling position (kx, ky, kz) along the sampled trajectory in the coordinate system of k-space.

With conventional receiving coils that have, for example, an aperture of ⅙ of the FOV, the convolution kernel is effectively so small that the measured sampling value corresponds only to a single discrete k-space point at the current sampling position (kz, ky, kz). If, however, receiving antennae with smaller dimensions (for example, an aperture of 1⁄60 of the FOV) are used, the convolution kernel is much larger and extends essentially over numerous k-space points, so that the measured sampling value corresponds, for the respective receiving antenna, to a weighted average value of the data of numerous k-space points.

The present invention differentiates between k-space points at positions at which data are acquired, and k-space points at positions at which no data are acquired. Herein, the above-described current sampling position lies at least once at the position of a k-space point at a position at which data are acquired. By contrast, the current sampling position is typically not situated at a position of a k-space point at a position at which no data are acquired. An exception is k-space points wherein the acquired data are noise-infested. These k-space points can also be associated, according to the invention, with the set of k-space points at positions at which no data are acquired, by the data that were acquired at that position being rejected, and not used for reconstruction.

Summarizing, the set of k-space points at respective positions at which no data are acquired can be assembled from the following types of k-space points:
- K-space points for which no data can be acquired with the data acquisition sequence being used. This is the case, for example, with ZTE-MR methods for k-space points in the region of the k-space center.
- K-space points that are not sampled due to (intentional) underscanning (undersampling).
- K-space points at positions at which data are (or would be) acquired that are or would be noise-infested.

Herein, the aperture of each of the receiving antennae is configured such that, for acquisition of data at a respective k-space point, the main lobe of the respective receiving antenna also extends over k-space points that are adjacent to the respective k-space point. By this approach, the respective receiving antenna acquires a type of weighted mean value of these adjacent k-space points and the respective k-space point, when the data are acquired with the respective receiving antenna at the position of the respective k-space point.

It is assumed that the spectral sensitivity of the respective receiving antenna has a particular (maximum) value when data are acquired with the respective receiving antenna at the position of the respective k-space point. The aperture of the respective receiving antenna is designed so that the main lobe or the main footprint of the respective receiving antenna also extends over k-space points (or, more precisely, over positions of k-space points) in the vicinity of the respective k-space point at the position of which data are currently being acquired. The main lobe or the main footprint of a respective receiving antenna in accordance with the invention defines a region in k-space around the k-space point at the position of which data are currently being acquired. Also in accordance with the invention, the spectral sensitivity of the respective receiving antenna in this region is never below a pre-determined percentage (in particular 5%) of the specified (maximum) value. Thus, when it is stated herein that the main lobe or the main footprint extends over adjacent k-space points or over a particular distance, this means that the (absolute) spectral sensitivity over these adjacent k-space points, or over the particular distance, is at least the pre-determined percentage of the maximum value.

In a further method step, reconstruction of all image points that correspond to all k-space points takes place, using the sensitivity profiles of the receiving antennae in order also to take account of data for k-space points at the positions of which in k-space, no data were acquired. Since the sensitivity profile of each receiving antenna is used in the reconstruction, the spectral sensitivity of the respective receiving antenna is effectively taken into account in the reconstruction. In order to take account of k-space points at positions in k-space at which no data were acquired, such missing data can be determined (estimated or interpolated). It is also possible, however, for the reconstruction to take place without the determination of data at such k-space points at which no data were acquired. In this case, the data of the adjacent k-space points, at positions at which data were acquired in k-space, are suitably processed during the reconstruction in order, on the basis of this data, to include in the reconstruction the missing information from data of the k-space points at which no data were acquired in k-space.

It should be noted that the (absolute) spectral sensitivity corresponds to the (absolute) spatial sensitivity of the respective receiving antenna, since the spectral sensitivity can be converted, by Fourier transformation, into the spatial sensitivity (and vice versa). Therefore, the sensitivity profile of the respective receiving antenna used for reconstruction can be either the (absolute) spectral sensitivity profile or the (absolute) spatial sensitivity profile.

Because the main lobe of the receiving antennae extends, during the data acquisition at a particular k-space point, also over k-space points adjacent to this particular k-space point, starting from the data acquired with the receiving antennae, all image points can be reconstructed with a good quality, even though data at some k-space points were not acquired.

The reconstruction according to the invention makes use of the fact that, during acquisition of the data at the position of a particular k-space point with the receiving antennae, data of k-space points that lie adjacent to the particular k-space point are also acquired. This allows data of k-space points to be calculated for the positions at which no data were acquired.

Since the main lobe of each receiving antenna also extends, for acquisition of the data at a particular k-space point, over k-space points adjacent to the particular k-space point, the data acquired at the position of the particular k-space point implicitly also contains (represents) data of these adjacent k-space points. Since at least particular k-space points are sampled with the multiple receiving antennae, on the basis of the data acquired for the particular k-space points, the data of the k-space points at positions at which no data were explicitly acquired can then be calculated. The receiving antennae have different sensitivity profiles. Furthermore, the receiving antennae are arranged at different positions relative to the examination object.

In a preferred embodiment of the invention, the data are acquired (entered into k-space) along trajectories that extend radially through k-space. In order to acquire the data for each of these trajectories, an RF excitation pulse is radiated.

According to the invention, the data acquisition can take place two-dimensionally or three-dimensionally. With a two-dimensional data acquisition, the radially extending trajectories proceed in one plane. Normally, the radial trajectories proceed, in the two-dimensional case and in the three-dimensional case, outwardly in straight lines from the k-space center.

In order to acquire the data according to the invention with the shortest possible echo time (UTE or ZTE), the gradients with which the course of the respective trajectory is determined are activated before the radiation of the RF excitation pulse. In this embodiment, the data are acquired in the form of a free induction decay (FID) signal at the position of the respective k-space point along a trajectory.

This data acquisition with the shortest possible echo time advantageously also enables hard tissue to be represented in the reconstructed MR image.

According to a further inventive embodiment, the reconstruction of all image points is based on the following equation (1):

$$C_l(k_x,k_y,k_z) \otimes I(k_x,k_y,k_z) = I_l(k_x,k_y,k_z), l=1 \ldots N_{Ant} \quad (1).$$

In this equation (1), $N_{Ant}$ represents the number of receiving antennae used. $I_l(k_x, k_y, k_z)$ represents the data acquired at the sampling position $(k_x, k_y, k_z)$ in k-space by the l-th receiving antenna. $C_l(k_x, k_y, k_z)$ represents the spectral sensitivity profile of the l-th receiving antenna at the sampling position $(k_x, k_y, k_z)$. $I(k_x, k_y, k_z)$ represents the data of the k-space point $(k_x, k_y, k_z)$. By use of the inverse Fourier transform, the image data i(x, y, z) are determined from the data $I(k_x, k_y, k_z)$.

For two-dimensional data acquisition, the reconstruction of all image points is based on the following equation (1a):

$$C_l(k_x,k_y) \otimes I(k_x,k_y) = I_l(k_x,k_y), l=1 \ldots N_{Ant} \quad (1a).$$

In order to reconstruct all the image points correctly in the reconstruction, in particular the data $I(k_x, k_y, k_z)$ of each k-space point $(k_x, k_y, k_z)$, are calculated on the basis of linear equations that are created for each sampling position and for each receiving antenna according to the equation (1) or (1a).

The number of receiving antennae used should satisfy the following inequality (2).

$$N_{Ant} \geq \frac{1}{1 - \frac{N_{absent}}{N_{total}}}, \quad (2)$$

In (2), $N_{Ant}$ is the number of receiving antennae used for parallel data acquisition, $N_{absent}$ is the number of k-space points not sampled, and $N_{total}$ is the number of all k-space points (in Cartesian layered scanning, for example, $N_{total}=N^2$).

In a matrix size of N×N (e.g. N=128), there are $N^2$ k-space points, so that the data $I(k^x, k_y)$ are determined at $N^2$ positions in k-space, where $1 \leq k_x, k_y \leq N$, in order to determine $N^2$ image points i(x, y), where $1 \leq x, y \leq N$ (i(x, y)=$F^{-1}$ ($I(k_x, k_y)$)). The k-space data or MR signals $I_l(k_x, k_y)$ acquired with the respective receiving antenna 1 are underscanned. This means that not all, but only (N×N−$N_{absent}$) elements of the matrix are known. In MR methods with an extremely short echo time (ZTE), essentially only the data in the region of a k-space center are unknown.

If the spectral sensitivity profiles $C_l(k_x, k_y)$ or the corresponding spatial sensitivity profiles $c_l(x, y)$ ($c_l(x, y)=F^{-1}$ ($C_l(k_x, k_y)$)) of the receiving antennae are known, there exist N×N unknowns in the matrix $I(k_x, k_y)$ and (N×N−$N_{absent}$)· $N_{Ant}$ linear equations. The N×N unknowns can be calculated with this equation system if the number of linear equations is greater than the number of unknowns. This is precisely the case when the previously described inequality (2) is fulfilled.

Therefore, according to the invention, the reconstruction problem for an underscan is reduced to the problem of solving a system of linear equations, which is possible with known algebraic methods. The equation system defined by equation (1) or (1a) can be solved with iteratively operating algorithms or can be formulated and solved as a linear optimization problem with regularizing.

For the inventive method, knowledge of the sensitivity profiles of the receiving antennae is required, wherein the sensitivity profile can be expressed either in the image domain as $c_l(x, y, z)$ or in k-space as $C_l(k_x, k_y, k_z)$. For this purpose, $C_l(k_x, k_y, k_z)=F(c_l(x, y, z))$ applies, or $c_l(x, y, z)=F^{-1}(C_l(k_x, k_y, k_z))$, wherein F represents the Fourier transform.

It should be noted that $c_l(x, y, z)$ can represent either the absolute sensitivity profile or the normalized sensitivity profile of the receiving antenna, which represents a relative sensitivity profile with respect to a particular receiving antenna (e.g. the "body coil") which has a homogenous sensitivity profile over the entire field of view, FOV. Mathematically, this is equivalent to dividing equation (1) by a constant. This procedure would modify the ultimate solution only by a scaling factor, which influences only the global image intensity (a parameter that can be used as desired by a user), but not the relative image contrast.

The simplest procedure for calibrating the normalized sensitivity profiles of the receiving antennae is described in relation to SENSE (SENSitivity Encoding for fast MRI) (Klaas Preussmann et al. 1999). This method uses a short pre-scan in order to acquire a few calibration k-space rows round the k-space center. It should be noted that the sensitivity profiles pre-calibrated in this way do not depend on the trajectories that are used later for data acquisition or on T1/T2 tissue contrasts and therefore can be re-used for every other MR imaging sequence.

A further possibility for determining the sensitivity profile of the respective receiving antenna is the following procedure:

Determining spatially resolved object parameters describing electromagnetic properties of an examination object. The examination object is herein the examination object from which the MR image is to be generated by means of the magnetic resonance apparatus.

Determining coil geometry parameters describing the spatial arrangement of the receiving coils in the magnetic resonance apparatus.

Determining the sensitivity profile of the respective receiving antenna by simulation in a model described by the object parameters and the coil geometry parameters.

Further details can be found in the subsequently published German patent application DE 102015203306 A1.

According to a preferred inventive embodiment, during the step of acquiring the data in k-space, an RF excitation pulse is radiated, and a part of the data is acquired after a first time span following the RF excitation pulse. In addition, after a second time span following the RF excitation pulse, further data (e.g. gradient echo signals) are acquired in k-space. The second time span is larger (longer) than the first time span. This means that the further data are acquired following the first acquired data. While the first acquired data are not acquired for each k-space point, the further data are acquired for each k-space point. The sensitivity profiles of the receiving antennae can now be calculated dependent upon the further data, as is known from radial SENSE. Thereby, the sensitivity profiles can be used for reconstruction of all the image points. The sequence used for this procedure is also known as a dual echo sequence.

This embodiment effectively acquires data in k-space twice: once with the shortest possible echo time (ZTE or UTE) and once with a longer echo time. By this approach, two MR images can be reconstructed. The second MR image, which is reconstructed on the basis of the further data, can also be used for calculating the sensitivity profiles of the receiving antennae. By this technique, these sensitivity profiles can be used for the reconstruction of the MR image that is reconstructed on the basis of data acquired with a short echo time. Advantageously, no additional step for determining the sensitivity profiles of the receiving antennae is necessary.

According to a preferred inventive embodiment, depending on the aperture of the receiving antennae, a minimum spacing is determined between k-space points at positions at which data are acquired. During acquisition of the data in k-space, this minimum spacing is maintained so that the positions of the k-space points at which data are acquired have at least (at best, exactly) this minimum spacing. Only when it has been ensured that any two adjacent k-space points at positions at which data are acquired have at most this minimum spacing, can it be ensured that, in the reconstruction of all image points, all the image points can actually be correctly reconstructed.

According to this embodiment, depending on the aperture of the receiving antennae, a measure for the underscanning can then be determined so that, despite this underscanning, it is nevertheless possible according to the invention to reconstruct all the image points correctly.

According to a preferred version of the embodiment described above, a number n can be determined as the largest natural number that fulfills the inequality (3).

$$n < \frac{1}{A \times \Delta k}. \quad (3)$$

In (3), A is the aperture of the receiving antennae and $\Delta k$ is the discretization interval used in the digitization of the acquired MR data. The minimum spacing can then be calculated as the product of the number n and the discretization interval $\Delta k$.

The number n also corresponds to the acceleration factor R with which scanning of k-space can be accelerated. For Cartesian sampling of k-space, it is sufficient, for example, to sample only every n-th row (or column) in order nevertheless to be able to reconstruct all the image points correctly according to the invention.

According to a further inventive embodiment, an underscanning rate is determined depending on the size of the receiving antennae, in particular, dependent upon the aperture of the receiving antennae (e.g. dependent upon the circle diameter d or the radius d/2 for circular receiving antennae). This underscanning rate corresponds to the acceleration factor R. The underscanning rate provides a measure for underscanning that is still just possible that nevertheless, according to the invention, allows all the image points to be correctly reconstructed. The underscanning rate is proportional to the reciprocal of the aperture of the receiving antennae, as described, as an example, in the following.

1. The aperture of the receiving antennae (i.e. the spatial penetration depth) is approximately the same as the circular radius d/2 in a circular receiving antenna.
2. The spectral footprint of the receiving antennae extends essentially over $2/(d \times \Delta k)$ discretization intervals.
3. For example, the (maximum) acceleration rate R for parallel imaging with two-dimensional Cartesian trajectories is then given by $R=2/(d \times \Delta k)$. This means that only every R-th K-space row is to be sampled.

In the context of the present invention, a further method for calculating an aperture of a receiving antenna of a magnetic resonance apparatus is also provided. This method has the following steps.

In a first step of this further method, a (smallest possible) radius (in the following known as the k-space radius is determined), so that, when a sphere of this k-space radius is constructed around each k-space point at the position of which data are acquired, each of the k-space points at which no data are acquired is also within at least one of these spheres.

A possibility for the previously described determination of the k-space radius is as follows:
1. Placement of a construction radius at an initial value (e.g. half the discretization interval).
2. Setting the k-space radius equal to the construction radius.
3. Testing whether the condition described above is fulfilled. If the condition is fulfilled, the construction radius corresponds to the k-space radius that is to be determined and the procedure for determining the k-space radius ends. If the condition is not (yet) fulfilled, the construction radius is increased by a predetermined amount (e.g. half the discretization interval) and the procedure jumps back to step 2.

The condition described above is fulfilled if spheres with the k-space radius which are present round each k-space point, at the position of which data is acquired, also cover each of those k-space points at the position of which no data is acquired.

In a further step of the further method, the aperture of the receiving antenna is calculated dependent upon this k-space radius.

Because the aperture of the receiving antenna is determined or calculated dependent upon the previously defined k-space radius, the receiving antenna can be configured such that, despite underscanning of k-space, the data of each k-space point can be calculated if the sampling takes place with a number of correspondingly configured receiving antennae. For this purpose, the respective receiving antenna is configured so that its main lobe also extends over adjacent k-space points of the particular k-space point if the data of a particular k-space point is acquired with the respective receiving antenna.

Thus, if the aperture of the receiving antenna is so configured that the main lobe of the respective receiving antenna extends effectively spherically with the previously determined k-space radius round the respective k-space point at the position of which data are acquired, then data are also acquired from k-space points adjacent to the respective k-space point. Through the determination of the k-space radius described above, it is thus ensured that data are acquired from all k-space points, even if k-space is incompletely sampled.

A plurality of possibilities exist for determining the k-space radius:

One possibility is for all regions within k-space to be determined in which only k-space points lie at positions at which no data were acquired. At the edge of these regions, by definition, there are then k-space points at positions at which data were acquired. If the k-space radius is now determined such that spheres, which each have as a center point one of these k-space points lying at the edge, have dimensions such that all k-space points of the respective region lie at least within one of these spheres, then the condition for this region is fulfilled. The k-space radius that is sought then corresponds to the largest k-space radius that is determined for one of these regions.

Another possibility is to determine the k-space radius on the basis of the k-space points that lie on a particular trajectory and at the position of which no data were acquired. If, at the start of a trajectory, there exist n k-space points at positions for which no data were acquired, then before data are acquired for the first k-space point on this trajectory, the k-space radius can be determined as the product of this number n and the discretization interval $\Delta k$. In a similar way, the k-space radius can be determined if, at the end of a trajectory after a k-space point at the position of which data were acquired, there still exist n k-space points at positions at which no data were acquired. In this case, also, the k-space radius is determined as the product of this number n and the discretization interval $\Delta k$. If the number n of k-space points at positions of which no data were acquired is different at the start and/or at the end of the trajectories, the k-space radius is determined on the basis of the largest number n that was determined for one of those trajectories.

If the k-space points at positions at which no data were acquired do not lie at the start or at the end of a trajectory, the following possibility can be used. In a first step, among all the trajectories, the largest number of k-space points that lie adjacent on the same trajectory, and at positions of which no data were acquired, is determined. In other words, the respective number or set of these k-space points in the readout direction of the respective trajectory is acquired for the data both before and after this set, respectively limited by a k-space point. If this largest quantity corresponds to the number m, then n (m+1)/2. The k-space radius to be determined is then determined in the second step as the product of this number n and the discretization interval $\Delta k$.

In the event of an underscan in which whole k-space rows are not sampled, the k-space radius can be determined as follows. If the number of adjacent k-space rows that are not sampled lie at the edge of k-space (that is, are not included in sampled k-space rows), the k-space radius is determined as the product of this number n with the discretization interval $\Delta k$. If, however, the number of adjacent k-space rows that are not sampled is included by the sampled k-space rows (i.e. in the layer, at least one sampled k-space row lies in front of or behind the non-sampled k-space rows), then the number n is calculated starting from the number m as n=(m+1)/2. The k-space radius is then determined in the second step as the product of this number n and the discretization interval $\Delta k$.

It should be noted that in two-dimensional k-space (i.e. for a two-dimensional data acquisition), the k-space radius can be determined on the basis of circles rather than spheres. Each k-space point at the position of which no data are acquired must then lie within one of the circles that are created with the k-space radius round those k-space points at the position of which data are acquired.

The discretization interval gives the spacing between two adjacent k-space points. In the case of radial data acquisition, it is the case that $\Delta k = \Delta k_r$, where $\Delta k_r$ defines the spacing between two adjacent k-space points on the radially extending trajectories. In the case of Cartesian data acquisition, $\Delta k = \Delta k_x = \Delta k_y = \Delta k_z$.

The aperture A of the receiving antenna satisfies the following inequality (4).

$$A < \frac{1}{n \times \Delta k}. \qquad (4)$$

If the k-space radius is not determined via the number n, the aperture can also satisfy the following inequality (5).

$$A < \frac{1}{r}, \qquad (5)$$

where r is the k-space radius.

If the aperture A of the receiving antenna satisfies the inequality (4) or (5), it is ensured that the main lobe of the receiving antenna also extends on the trajectory over n discretization intervals, which lie in a particular direction adjacent to a particular k-space point at the position of which data is acquired. In other words, the main lobe of the receiving antenna extends over n discretization intervals (and thus k-space points) that lie on the trajectory in front of the particular k-space point and over n discretization intervals (and thus k-space points) that lie on the trajectory behind the particular k-space point.

According to a generally applicable rule, the penetration depth or permeation depth of a receiving antenna in the form of a simple circular loop approximately corresponds to the radius of this circle. In other words, the penetration depth or permeation depth of a circular antenna approximately corresponds to the radius of this circle (called the antenna radius below) and begins at the surface of the circular loop.

A gap in k-space in which at no position data are acquired amounts to n×$\Delta k$ or corresponds to n times the discretization interval. In order for the main lobe of a receiving antenna to extend over at least n×$\Delta k$, the antenna aperture or the penetration depth should correspond to the reciprocal of the spectral bandwidth or $$\frac{1}{n \times \Delta k}.$$

Since the dimension of the field of view FOV corresponds to the reciprocal of the discretization interval, the antenna aperture and thus the antenna radius of a circular receiving antenna should be not more than $$\frac{1}{n} \times FOV.$$

In particular, the antenna radius dependent on which the aperture of the receiving antenna is calculated, corresponds to a maximum possible antenna radius, however the inequality (4) or the inequality (5) is fulfilled.

In the selection of the antenna radius, according to the invention, there are two possibilities:

According to the first possibility, the antenna radius is selected to be as large as possible, although, in particular, the inequality (4) or the inequality (5) is fulfilled. This first possibility offers the advantage of a good reception quality of the receiving antenna as compared with a smaller receiving antenna.

According to the second possibility, the antenna radius is selected to be as small as possible. This second possibility has the advantage that the previously defined condition that each k-space point at the position of which no data is acquired lies within at least one of these spheres is very reliably fulfilled. The smaller the antenna radius is selected to be, the more k-space points will lie in two or even more spheres.

According to a preferred inventive embodiment, the apertures of the receiving antennae are equal-sized.

The inventive method for calculating an aperture can be combined with the inventive method for generating an MR image.

With the further inventive method, for example, the problem that during a ZTE sequence a particular region in the k-space center is not acquired due to the dead time can be solved. Depending on the extent of this region, with the further inventive method, the size (in particular, the aperture) of the receiving antennae can be calculated so that it is possible to acquire the missing k-space data in the k-space center in order to be able to reconstruct all the image points correctly according to the invention.

This will now be described using an exemplary procedure.
1. It is assumed that the gap in the k-space center not acquired with the ZTE sequence has a radial size of $3 \times \Delta k$ (3 discretization intervals).
2. Thus the spectral footprint of the receiving antennae should extent radially essentially at least over $3 \times \Delta k$ (3 discretization intervals).
3. Thus the aperture (penetration depth) of the receiving antennae should be approximately equal to 1/(spectral footprint), i.e. at most $1/(3 \times \Delta k)$.
4. From $FOV \sim 1/\Delta k$, it follows that the aperture of the receiving antennae should amount to not more than FOV/3.
5. Since the aperture of the receiving antennae approximately corresponds to the circular radius of the receiving antennae, a value for the circle diameter of not more than $\frac{2}{3} \times FOV$ results.

The present invention also encompasses a magnetic resonance apparatus for generating an MR image by execution of an imaging sequence. The magnetic resonance apparatus has a data acquisition scanner that has a basic field magnet, a gradient coil system, at least one RF antenna, a number of receiving antennae and a control computer that controls the gradient coil system and the RF antenna and for receiving MR data detected by the receiving antennae. The magnetic resonance apparatus is designed to acquire data in the k-space with the receiving antennae. Herein, this data are acquired only at particular positions of particular k-space points wherein the number of the particular k-space points is smaller than the number of all k-space points that are defined by the imaging sequence. The aperture of each of the receiving antennae is configured such that, for acquisition of data at a respective k-space point, the main lobe of the respective receiving antenna also extends over k-space points adjacent to the respective k-space point. The magnetic resonance apparatus is further configured to reconstruct all image points that correspond to all k-space points, using sensitivity profiles of the receiving antennae, wherein the data of k-space points at positions at which no data were acquired is also taken into account.

The advantages of the inventive magnetic resonance apparatus correspond to the advantages of the inventive method for creating an MR image by means of an imaging sequence with a magnetic resonance apparatus, as set out in detail above.

The present invention also encompasses a computer for determining a receiving antenna for a magnetic resonance apparatus. The computer has a processor and an output interface (display). The computer, i.e. the processor thereof, is configured to determine a k-space radius that fulfills the following condition. If, for each k-space point at the position of which data are acquired, a sphere with this k-space radius is constructed around the respective k-space point, then each k-space point at the position of which no data are acquired also lies within at least one of these spheres. The computer/processor is further configured to calculate, independently of this k-space radius thus determined, a maximum aperture of the receiving antenna and to present information regarding this maximum aperture via the output interface.

The advantages of the inventive computer correspond essentially to the advantages of the inventive method for calculating an aperture of a receiving antenna of a magnetic resonance apparatus, as set out in detail above.

The inventive computer can be combined with the inventive magnetic resonance apparatus.

The invention also encompasses a non-transitory, computer-readable data storage medium encoded with programming instructions, the storage medium can be loaded into a control computer of a magnetic resonance apparatus, and the program code, when executed by the control computer, causes the control computer to operate the magnetic resonance apparatus in order to implement any or all embodiments of the inventive method as described above. The program code may require other program means, e.g. libraries and auxiliary functions in order to realize the relevant embodiments of the method. The program code may be a source code (e.g. C++) which must still be compiled (translated) and stored or that must only be interpreted, or can be an executable software code that, for execution, need only be loaded into the corresponding processor or control computer.

The electronically readable data carrier can be, for example, a DVD, a magnetic tape, a hard disk drive or a USB stick, on which electronically readable control information, in particular software (see above), is stored.

The present invention has the following advantages:

Through the use of receiving antennae with a relatively large main lobe in the spectral domain, on acquisition of data at the position of a particular k-space point, data can also be acquired indirectly from adjacent k-space points. Advantageously, in this way, data from k-space points is acquired which otherwise could not be acquired or only in a noise-laden form.

Thereby, the acquisition of these k-space points which cannot be acquired with a particular sequence or only in a noise-laden form, for example with another sequence, is advantageously avoided.

Since, according to the invention, data are acquired from all the k-space points, advantageously, the extrapolation of missing data can be avoided.

Methods such as a computation-intensive iterative image correction or the use of prior knowledge concerning the expected image contrast or the anatomy of the examination object are advantageously not required since for the reconstruction, the data from all the k-space points is available.

The present invention encompasses a hardware configuration (in the form of a receiving antenna with a corresponding aperture), as well as a procedure for calculating missing data, for example, for ZTE MR methods. According to the invention, particular conditions for underscanning and a simple method for determining a suitable size (aperture) of receiving antennae as a function of the extent of the largest region of k-space points at the positions of which no data are acquired are provided.

According to the invention, a number of receiving antennae of a small size (small aperture) are used. The size (aperture) of the receiving antenna is related to the dimensions of the volume portion or the field of view FOV that is to be imaged. A receiving antenna with a small aperture has a spectral sensitivity profile (in the k-space) such that the main lobe extends over a plurality of k-space points round the current sampling position. In other words, the point response of the receiving antennae does not (any longer) correspond to a sharply delineated sampling position or therefore to a single k-space point, as is conventionally assumed according to the prior art. Rather, the inventively used receiving antennae have a larger footprint or a larger main lobe in the k-space.

According to the invention, a simple mathematical method is used in order to calculate missing data in k-space for any desired underscanned patterns. According to the invention, for this purpose, the use of a number of receiving antennae with a small aperture is combined with a parallel data acquisition.

With use of the present invention for a ZTE MR method, missing data from the region of the z-space center can be tolerated. Furthermore, data that have been acquired for k-space points in the outer region of the k-space and which are usually noise-infested can be excluded from the reconstruction. By this technique, only data of high quality or with a high signal-to-noise ratio that are acquired at positions of k-space points in the middle region of the k-space (i.e. not in the region of the center and not in the outer region) are used for image generation or reconstruction.

With the present invention, the main lobe or the main footprint can be determined independently of the receiving antennae (i.e. of the aperture of the receiving antennae) in order then, independently of the main lobe or the main footprint, to determine a measure for a possible underscanning or the acceleration factor R. Furthermore, it is possible according to the invention, starting from the largest gap in the k-space (i.e. starting from the k-space radius) to determine the aperture of the receiving antennae in order, despite this gap, to be able to reconstruct all the image points.

The present invention requires knowledge of the sensitivity profiles of the receiving antennae used, so that some embodiments concern the determination of these sensitivity profiles.

DESCRIPTION OF THE PREFERRED EMBODIMENTS

Figure 1:
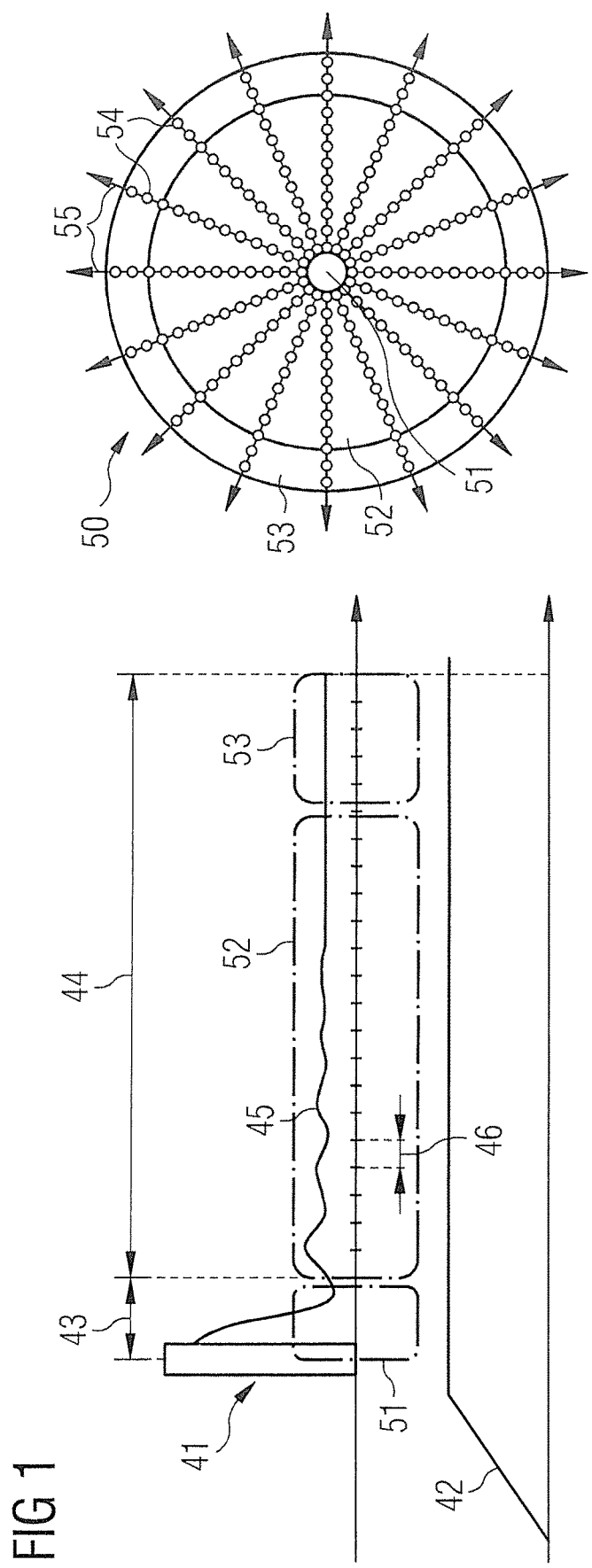
FIG. 1 shows the sequence for a ZTE MR method together with corresponding regions in k-space.
Figure 2:
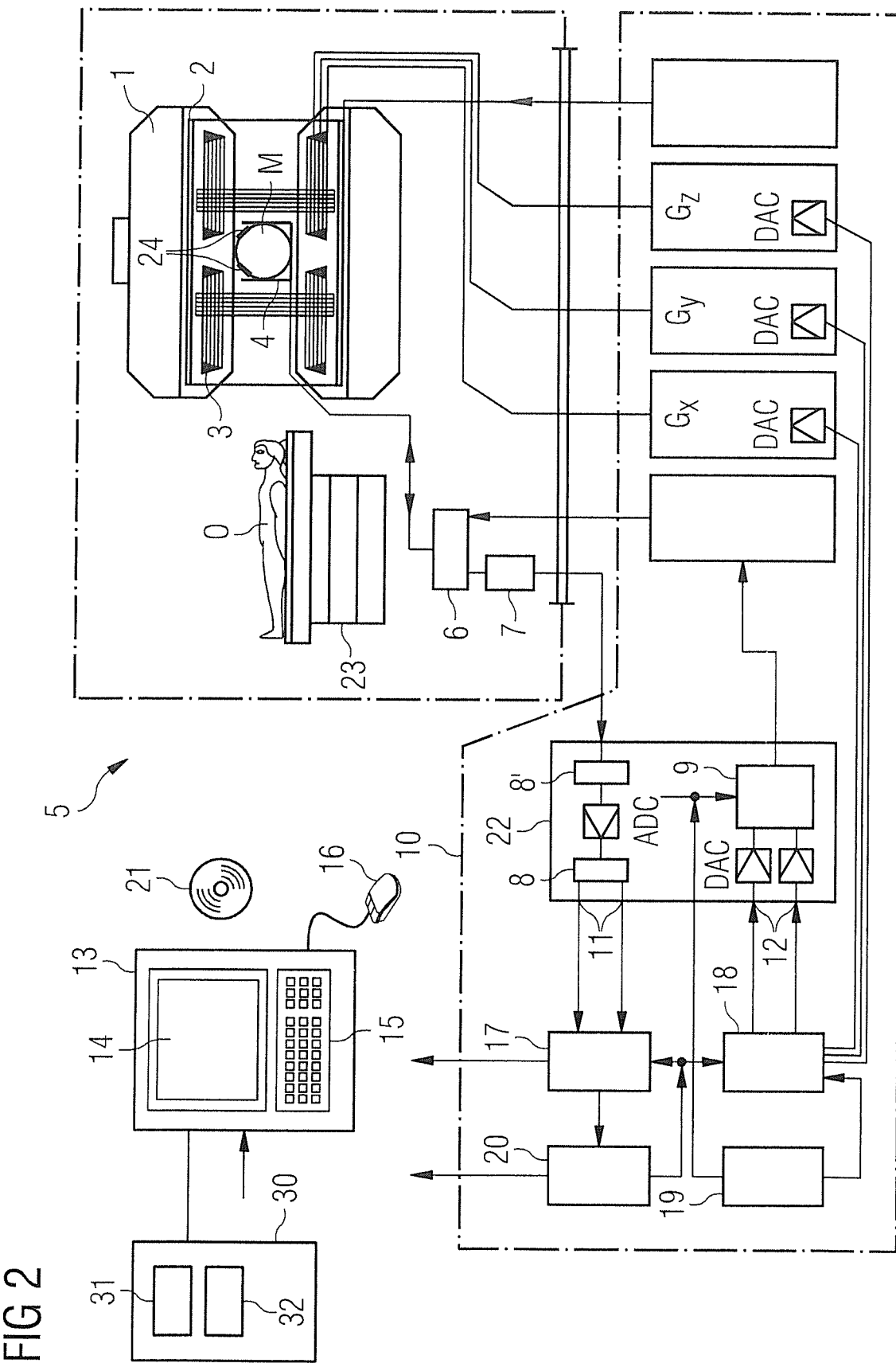
FIG. 2 shows a schematic representation of an inventive magnetic resonance apparatus.

FIG. 2 is a schematic illustration of an inventive magnetic resonance apparatus 5 (a magnetic resonance and/or nuclear spin tomography device). Herein, a basic field magnet 1 of the scanner of the apparatus generates a temporally constant, strong basic magnetic field for polarizing and aligning nuclear spins in an examination region of an object O, for example, a part of a human body to be investigated, who is examined lying on a table 23 in the scanner of the magnetic resonance apparatus 5. The high degree of homogeneity of the basic magnetic field required for magnetic resonance measurements is defined in a typically spherical measurement volume M in which the volume portion of the human body to be investigated is arranged. To support the homogeneity requirements and, in particular, to eliminate temporally invariable influences, "shim plates" made of ferromagnetic material are introduced at suitable sites. Temporally variable influences are eliminated by shim coils 2.

Inserted into the basic field magnet 1 is a cylindrical gradient coil system 3, composed of three sub-windings. Each sub-winding is supplied with current from an amplifier to generate a linear (also temporally variable) gradient field in the relevant direction of the Cartesian coordinate system. The first sub-winding of the gradient coil system 3 generates a gradient $G_x$ in the x-direction, the second sub-winding generates a gradient $G_y$ in the y-direction, and the third sub-winding generates a gradient $G_z$ in the z-direction. Each amplifier has a digital-analog converter, which is controlled by a sequence controller 18 for timely generation of gradient pulses.

Arranged within the gradient coil system 3 is one (or more) radio-frequency antennae 4 which convert the radio-frequency pulses emitted by a radio-frequency power amplifier into an alternating magnetic field for excitation of the nuclei and deflecting the nuclear spins of the object O under investigation or the region of the object O under investigation. Each radio-frequency antenna 4 has one or more RF transmitter coils and one or more RF receiving coils in the form of a ring-shaped, preferably linear or matrix-shaped arrangement of component coils. In addition, there are a number of relatively small receiving antennae 24, which have a small aperture. The alternating field emitted by the precessing nuclear spins, i.e. typically the nuclear spin echo signals evoked by a pulse sequence from one or more radio-frequency pulses and one or more gradient pulses, is also converted by the RF receiving coils of the respective radio-frequency antenna 4 and the receiving antennae 24 into a voltage (measurement signal), which is fed by an amplifier 7 to a radio-frequency receiving channel 8 of a radio-frequency system 22. The radio-frequency system 22, which is part of a control computer 10 of the magnetic resonance apparatus 5, also has a transmitting channel 9 in which the radio-frequency pulses for the excitation of the magnetic nuclear resonance are generated. The respective radio-frequency pulses are represented digitally in the sequence controller 18 as a sequence of complex numbers on the basis of a pulse sequence pre-determined by the system computer 20. This sequence of numbers is fed as a real part and an imaginary part, respectively, via inputs 12 to a digital-analog converter in the radio-frequency system 22, and are fed from there to a transmitting channel 9. In the transmitting channel 9, the pulse sequences are modulated onto a radio-frequency carrier signal, the base frequency of which corresponds to the resonance frequency of the nuclear spins in the measurement volume.

Switching from transmitting to receiving operation is performed by a transmit/receive switch (diplexer) 6. The RF transmitter coils of the radio-frequency antenna(e) 4 radiate(s) the radio-frequency pulses to excite the nuclear spins in the measurement volume M and resulting echo signals are sampled by the RF receiving coil(s). The corresponding magnetic resonance signals obtained are phase-sensitively demodulated in the receiving channel 8' (first demodulator) of the radio-frequency system 22 to an intermediate frequency, digitized in the analog-digital converter (ADC) and omitted by the output 11. This signal is then demodulated to the frequency 0. The demodulation to the frequency 0 and the separation into real and imaginary parts takes place, following digitizing in the digital domain, in a second demodulator 8. With an image computer 17, an MR image is reconstructed from the measurement data obtained in this way from the output 11. The administration of the measurement data, the image data and the control programs is carried out by the system computer 20. From a specification with control programs, the sequence controller 18 controls the creation of the desired pulse sequences and the corresponding sampling of k-space. The sequence controller 18 controls the timely switching of the gradients, the emission of the radio-frequency pulses at a defined phase amplitude, and the reception of the magnetic resonance signals. The time base for the radio-frequency system 22 and the sequence controller 18 is made available by a synthesizer 19. The selection of corresponding control programs for generating an MR image which are stored, for example, on a DVD 21, and the representation of the generated MR image, is carried out via a terminal 13, which has a keyboard 15, a mouse 16 and a screen 14.

Figure 3:
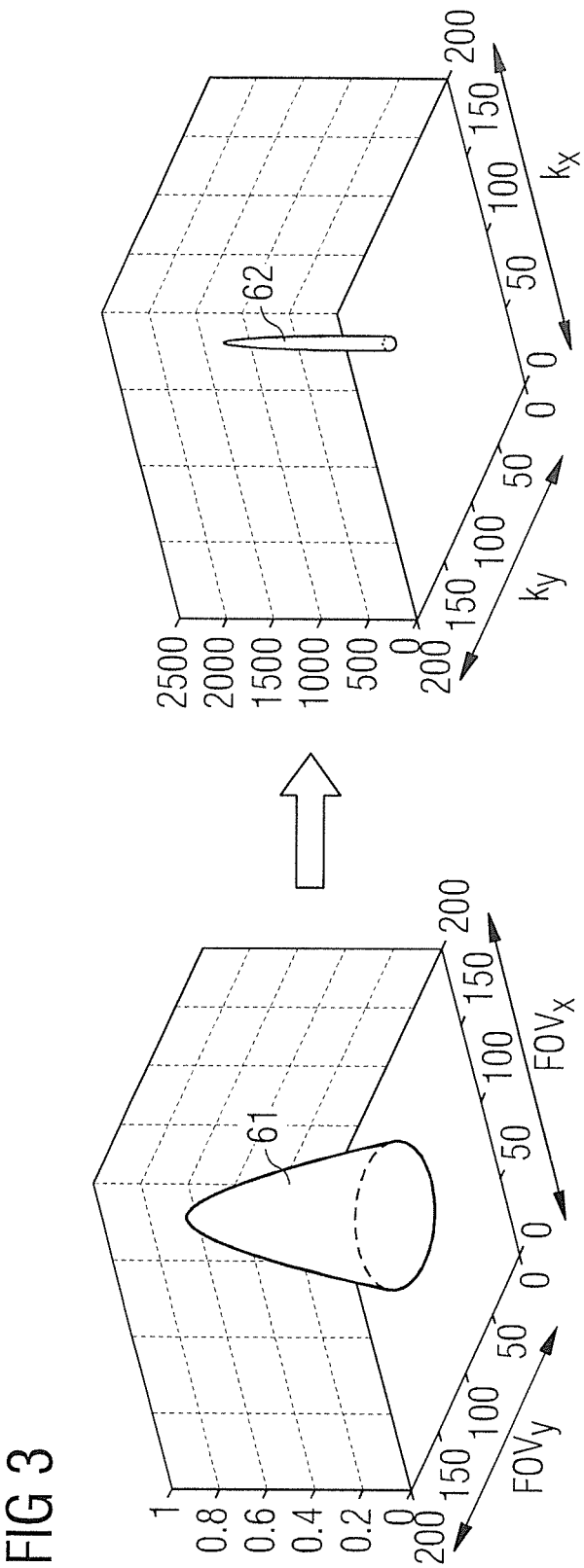
FIG. 3 shows the relationship between the sensitivity of a receiving antenna in the image domain and in the spectral domain for a large receiving antenna.

FIG. 3 shows, on the left side, an exemplary spatial sensitivity profile of a receiving antenna which has a spatial aperture (penetration depth), which approximately corresponds to ⅙ of the FOV. FIG. 3 shows the main lobe 61 in the spatial domain. The penetration depth corresponds to a region in which the spatial coil sensitivity does not fall substantially (i.e. the spatial coil sensitivity in this region never lies below a particular percentage (in particular 5%) of the maximum of the coil sensitivity in the image domain).

FIG. 3 shows, on the right side, the resultant spectral sensitivity profile of the same receiving antenna, which has a spectral footprint or a spectral main lobe 62 which approximately corresponds to 1/60 of the whole k-space. This corresponds to a k-space region in which the spectral sensitivity of the antenna does not fall substantially (i.e. the spectral sensitivity of the antenna in this region never lies below the pre-determined percentage (in particular 5%) of the maximum of the antenna sensitivity in k-space). If k-space covers, for example, 128×128 pixels, this means that such a receiving antenna acquires spectral energy mainly from a very small region round a single k-space point that extends essentially radially over less than one discretization interval Δk in k-space.

Figure 4:
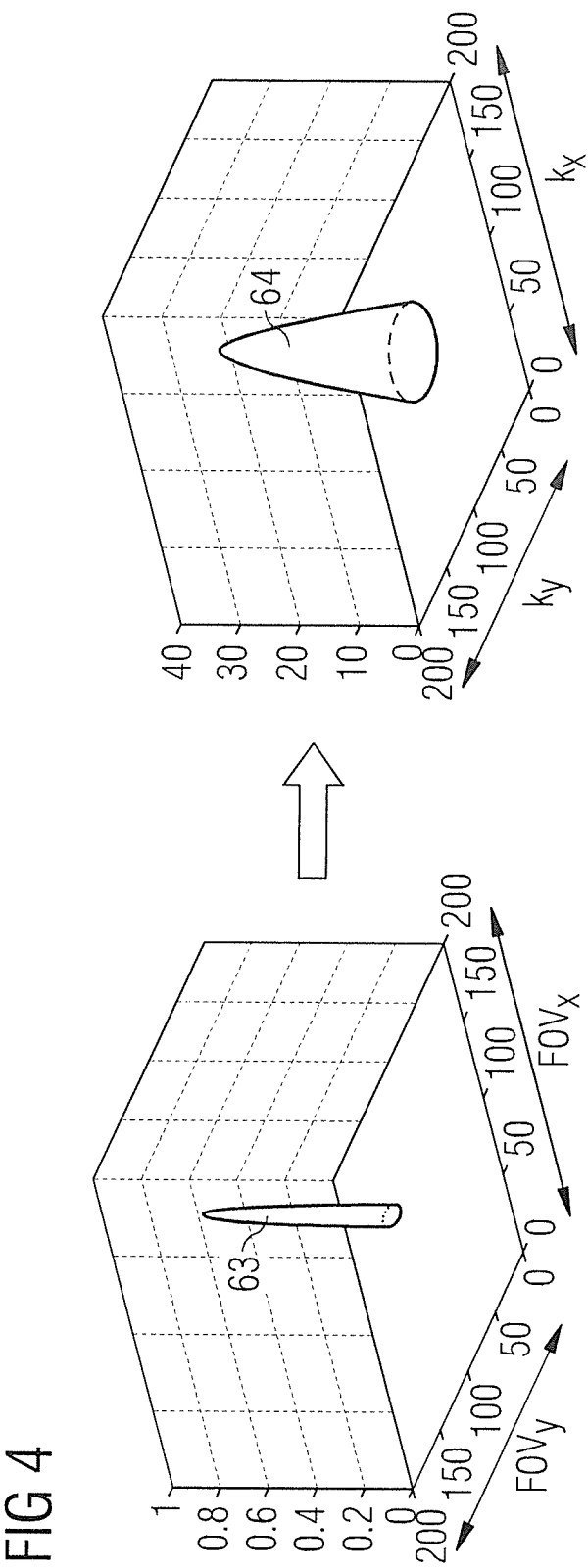
FIG. 4 shows the relationship between the sensitivity of a receiving antenna in the image domain and in the spectral domain for a small receiving antenna.

For comparison, FIG. 4 shows an exemplary spatial sensitivity profile of a receiving antenna that has a spatial aperture (penetration depth) that approximately corresponds to 1/60 of the FOV. FIG. 4 shows the main lobe 63 in the spatial domain. In this case, also, the penetration depth corresponds to a region in which the spatial sensitivity of the antenna does not fall substantially (i.e. the spatial sensitivity of the antenna in this region never lies below a pre-determined percentage of the maximum of the antenna sensitivity in the image domain).

As in FIG. 3, FIG. 4 shows, on the right side, the resultant spectral sensitivity profile of the same receiving antenna, which has a spectral footprint or a spectral main lobe 64 which approximately corresponds to ⅙ of the whole k-space. This corresponds to a k-space region in which the spectral sensitivity of the antenna does not fall substantially (i.e. the spectral sensitivity of the antenna in this region never lies below the pre-determined percentage (in particular 5%) of the maximum of the antenna sensitivity in the k-space). If k-space covers, for example 128×128 pixels, this means that such a receiving antenna acquires spectral energy mainly from a relatively large region that radially covers essentially 20 k-space points or discretization intervals Δk.

Figure 5:
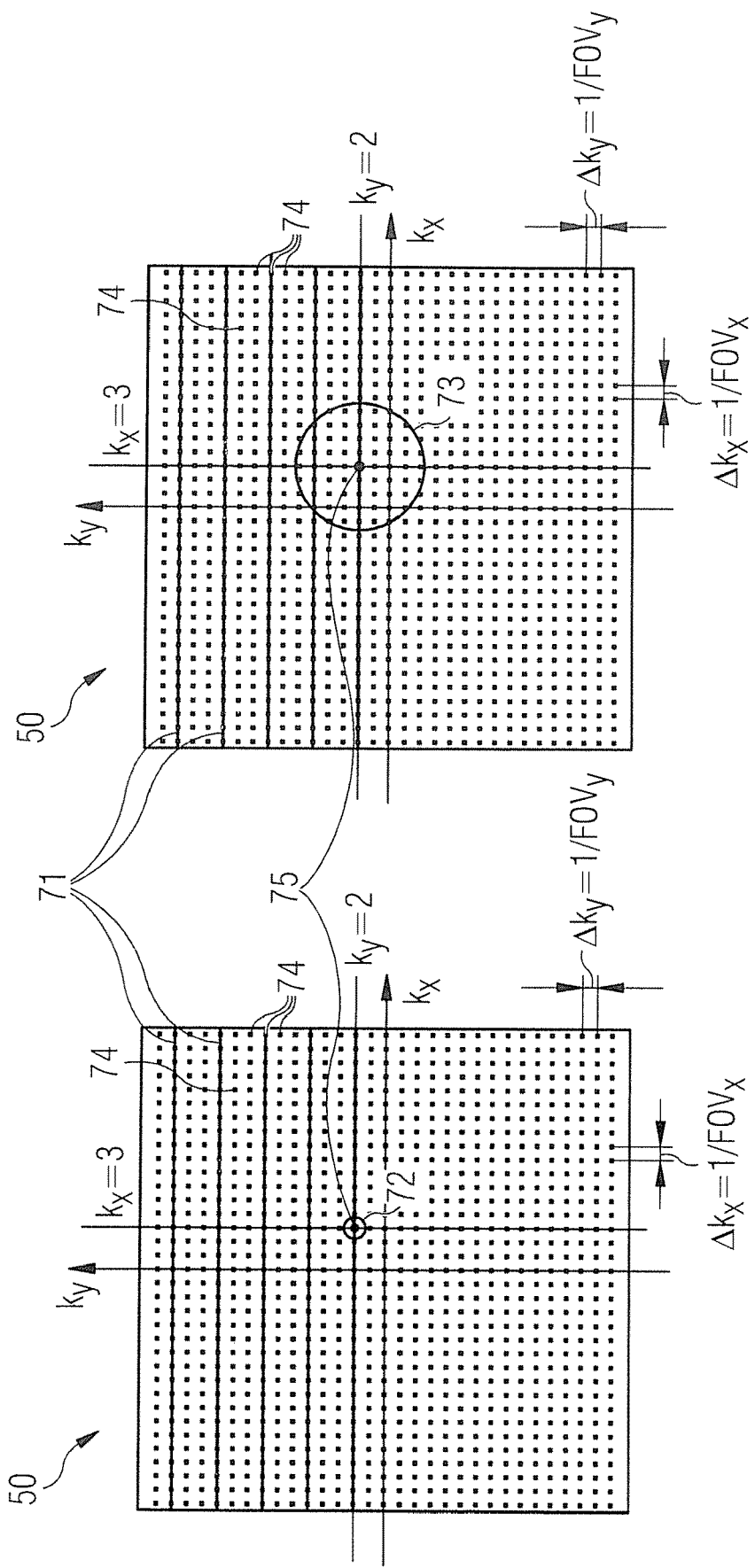
FIG. 5 shows a comparison between a conventional sampling and an inventive sampling of k-space.

With conventional data acquisition with a magnetic resonance apparatus, essentially data are acquired only in the immediate vicinity of the k-space point at the position at which the data acquisition takes place. It is apparent from the extent of the main lobe 72 (at left in FIG. 5) that, due to the sharply focused spectral sensitivity of a large receiving antenna, for each data acquisition at a particular k-space point, only the data of this particular k-space point 75 are acquired, since the sensitivity profile of the conventional receiving antenna does not extend over the k-space points adjacent to this particular k-space point. For sampling along the k-space rows 71, therefore (almost) only the data of the k-space points 74 lying on the k-space rows 71 are acquired.

In contrast thereto, with the inventive data acquisition, the data are acquired with a receiving antenna of relatively small aperture. If, in a similar way as shown at left in FIG. 5 for the conventional case, data are acquired for the k-space point 75, at the position $k_x=3$, $k_y=2$ with the smaller receiving antenna, due to the relatively larger main lobe 73 of the smaller receiving antenna, data are also acquired in a radius of 4×Δk round the position $k_x=3$, $k_y=2$, so that data are acquired from numerous adjacent k-space points 74.

Figure 6:
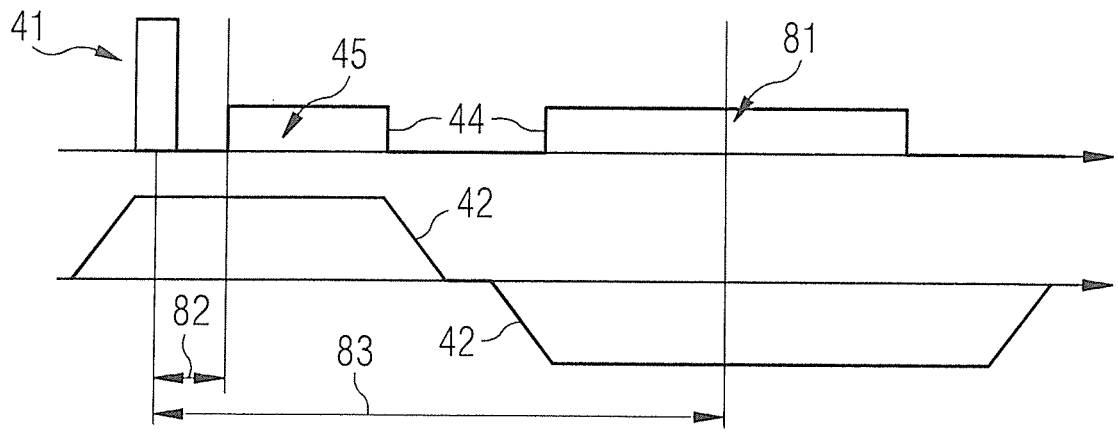
FIG. 6 shows a sequence diagram for an inventive embodiment.

FIG. 6 shows an inventive sequence diagram. Before the RF excitation pulse 41 is radiated, the gradients 42 are ramped up. A first data acquisition, wherein a free induction signal 45 is acquired, takes place after as short a dead time 82 as possible. This first data acquisition takes place along radial trajectories with which, due to the unavoidable dead time 82, data cannot be acquired from the region of the k-space center.

Following the first readout time 44 after the first data acquisition, further gradients 42 are switched (activated) in order to generate a gradient echo 81, which is acquired at a further readout time 44. The data acquired during the second data acquisition are used to determine or calibrate the spectral sensitivity profiles of the receiving antennae. These determined sensitivity profiles of the receiving antennae are used, in order, in the reconstruction of an MR image from the first data, also to take account of or determine the data of those k-space points in the center.

Furthermore, on the basis of the second data, a further MR image can be reconstructed.

Figure 7:
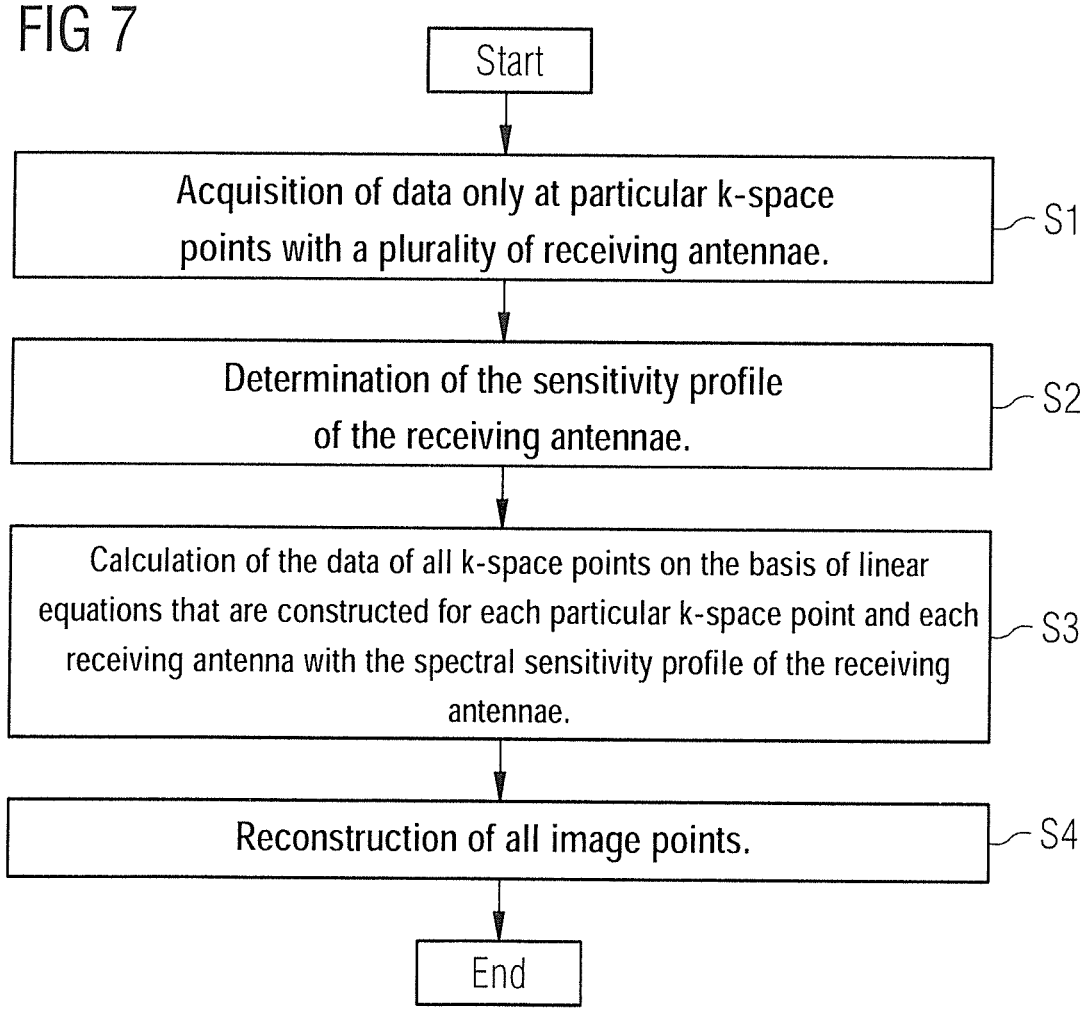
FIG. 7 is a flow diagram of an inventive embodiment.

FIG. 7 shows a flow diagram of an inventive embodiment.

In the first step S1, data are acquired at particular k-space points respectively by a number of receiving antennae. In the second step S2, the sensitivity profiles of the receiving antennae are determined. The receiving antennae are configured such that the main lobe of each receiving antenna also extends, when data are acquired at the position of a particular k-space point, over adjacent k-space points.

Since the main lobe of each receiving antenna also extends over adjacent k-space points, in step S3, the data of all k-space points can be calculated on the basis of linear equations. Herein, for each k-space point at a position at which data were acquired, and for each receiving antenna, a respective linear equation can be created so as to also calculate the data for those k-space points at positions at which no data were acquired.

Lastly, in step S4, the reconstruction of all image points takes place.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating a magnetic resonance (MR) image by executing an imaging sequence with a data acquisition scanner of a magnetic resonance apparatus, said method comprising:
   operating the data acquisition scanner to acquire MR data with a plurality of receiving antennae of the data acquisition scanner and entering the acquired MR data into a memory organized as k-space comprising a plurality of k-space points, with the acquired MR data being entered into k-space at respective positions of particular k-space points with a number of said particular k-space points being smaller than a number of all k-space points belonging to the imaging sequence;
   configuring an aperture of each of the receiving antennae to cause data to be acquired at a respective k-space point, with a spectral main lobe of each receiving antenna also extending over k-space points that are adjacent to the respective k-space point; and
   in an image reconstruction computer, reconstructing all image points that correspond to all of said k-space points, using respective sensitivity profiles of the receiving antennae to thereby take account of data from k-space points at positions at which no MR data were acquired.

2. A method as claimed in claim 1 comprising implementing said reconstruction based on, for acquisition of MR data at a position of a particular k-space point with the receiving antennae, data of k-space points situated adjacent to the particular k-space point are also acquired, in order to calculate said data of k-space points at said positions at which no MR data were acquired.

3. A method as claimed in claim 1 comprising:
   entering the acquired MR data into k-space along trajectories that extend radially through k-space; and
   acquiring data for each trajectory by radiating a respective radio-frequency (RF) excitation pulse for that respective trajectory.

4. A method as claimed in claim 1, comprising:
   implementing the reconstruction of all image points based on the following equation (1):

$$C_l(k_x,k_y,k_z) \otimes I(k_x,k_y,k_z) = I_l(k_x,k_y,k_z), l=1 \ldots N_{Ant} \quad (1),$$

wherein $N_{Ant}$ represents the number of receiving antennae, $I_l(k_x, k_y, k_z)$ represents the data acquired at the sampling position $(k_x, k_y, k_z)$ by the l-th receiving antenna, $C_l(k_x, k_y, k_z)$ represents the spectral sensitivity profile (64) of the l-th receiving antenna at the sampling position $(k_x, k_y, k_z)$, and $I(k_x, k_y, k_z)$ represents the data of the k-space point $(k_x, k_y, k_z)$.

5. A method as claimed in claim 4, comprising calculating the data $I(k_x, k_y, k_z)$ of each k-space point $(k_x, k_y, k_z)$ based on linear equations created for each sampling position $(k_x, k_y, k_z)$ according to the equation (1).

6. A method as claimed in claim 1, comprising:
   selecting the number of receiving antennae so as to satisfy the inequality $N_{Ant} \geq 1/(1-(N_{absent}/N_{total}))$ wherein $N_{Ant}$ represents the number of receiving antennae, $N_{absent}$ represents the number of k-space points at positions at which no MR data were acquired, and $N_{total}$ represents the number of all k-space points.

7. A method as claimed in claim 1 comprising:
   determining the respective sensitivity profiles of the receiving antennae by:
      determining a distribution of electromagnetic properties in a volume portion from which the MR image is generated;
      calculating an absolute B1 map of the volume portion dependent on the electromagnetic properties in the volume portion and dependent on geometric dimensions and a position of each of the receiving antennae; and
      determining the sensitivity profiles dependent on the B1 map.

8. A method as claimed in claim 1 comprising determining the respective sensitivity profiles of the receiving antennae by:
   determining a relative spectral sensitivity for each of the receiving antennae;
   determining a distribution of electromagnetic properties in a volume portion from which the MR image is generated, dependent on the relative spectral sensitivities; and
   calculating the sensitivity profiles dependent on the electromagnetic properties, geometric properties, and a position of each of the receiving antennae, and dependent on the relative spectral sensitivities of the receiving antennae.

9. A method as claimed in claim 1 comprising:
   acquiring the MR data and entering the acquired MR data into the memory organized as k-space by radiating an RF excitation pulse in the data acquisition scanner, and acquiring the MR data after a first time following radiation of the RF excitation pulse;
   operating the data acquisition scanner to acquire further MR data, and entering the further MR data into k-space, after a second time following the RF excitation pulse that occurs after the first time, with said further data being acquired at each k-space point;
   calculating a sensitivity profile for each of the receiving antennae starting from the further MR data and from a partial coil image reconstructed from MR data respectively acquired by each of the receiving antennae; and
   reconstructing all of the image points using said calculated sensitivity profiles of the receiving antennae.

10. A method as claimed in claim 1 comprising, dependent on the respective apertures of the receiving antennae, determining a minimum spacing between k-space points in k-space at positions at which MR data must be acquired in order to be able to actually reconstruct all of the image points.

11. A method as claimed in claim 10 wherein said minimum spacing is defined as a product of n and $\Delta k$, wherein n is the largest natural number that fulfills the inequality $n < 1/(A \cdot \Delta k)$, wherein A is the respective aperture of the receiving antennae and $\Delta k$ is the discretization interval.

12. A method as claimed in claim 1 comprising:
   dependent on the respective aperture of the receiving antennae, determining an underscanning rate at which k-space is underscanned; and making said underscanning rate proportional to a reciprocal of the respective aperture of the receiving antennae so that, despite said underscanning rate, all of the image points are reconstructed.

13. A method as claimed in claim 1 comprising calculating the aperture of at least one of said receiving antennae by determining a radius such that if, for each k-space point at a position at which said MR data are acquired, a sphere with said radius is constructed around the respective k-space point, then also the k-space points at positions at which no data are acquired also lie within at least one of said spheres, and calculating the aperture of the at least one receiving antenna dependent on said radius.

14. A method for calculating an aperture of at least one receiving antenna of a data acquisition scanner of a magnetic resonance apparatus used to acquire MR data that are entered into a memory organized as k-space at respective k-space points in k-space, by determining a radius such that if, for each k-space point at a position at which said MR data are acquired, a sphere with said radius is constructed around the respective k-space point, then also the k-space points at positions at which no data are acquired also lie within at least one of said spheres, and calculating the aperture of the at least one receiving antenna dependent on said radius.

15. A method as claimed in claim 14, comprising determining the radius by determining a number n of the k-space points that lie at the start or at the end of a trajectory in k-space and at the position of which no data are acquired, and multiplying the number n by the discretization interval $\Delta k$, and with the aperture A fulfilling the inequality $A < 1/(n \cdot \Delta k)$.

16. A method as claimed in claim 15 comprising acquiring said MR data with a receiving antenna comprising a circular loop, said loop having a radius that is not more than $(1/n) \cdot FOV$, wherein FOV is a dimension of a field of view corresponding to k-space.

17. A method as claimed in claim 16 wherein said radius of said loop is a maximum radius for which said inequality is fulfilled.

18. A magnetic resonance (MR) apparatus comprising:
an MR data acquisition scanner for executing an imaging sequence, comprising a plurality of receiving antennae;
a control computer configured to operate the data acquisition scanner to acquire MR data with a plurality of receiving antennae of the data acquisition scanner and entering the acquired MR data into a memory organized as k-space comprising a plurality of k-space points, with the acquired MR data being entered into k-space at respective positions of particular k-space points with a number of said particular k-space points being smaller than a number of all k-space points belonging to the imaging sequence;
each of the receiving antennae having an aperture that causes data to be acquired at a respective k-space point, with a spectral main lobe of each receiving antenna also extending over k-space points that are adjacent to the respective k-space point; and
an image reconstruction computer configured to reconstruct all image points that correspond to all of said k-space points, using respective sensitivity profiles of the receiving antennae to thereby take account of data from k-space points at positions at which no MR data were acquired.

19. A magnetic resonance (MR) apparatus comprising:
an MR data acquisition scanner comprising a plurality of receiving antennae, with at least one of said receiving antennae having an, wherein the scanner is used to acquire MR data that are entered into a memory organized as k-space at respective k-space points in k-space aperture; and
a computer configured to determine said aperture for said at least one of said receiving antennae by determining a radius such that it for each k-space point at a position at which said MR data are acquired, a sphere with said radius is constructed around the respective k-space point, then also the k-space points at positions at which no data are acquired also lie within at least one of said spheres, and calculating the aperture of the at least one receiving antenna dependent on said radius.

20. A computer for calculating an aperture of at least one receiving antenna of a data acquisition scanner of a magnetic resonance apparatus used to acquire MR data that are:
entered into a memory organized as k-space at respective k-space points in k-space, said computer comprising a processor configured to determine a radius such that if, for each k-space point at a position at which said MR data are acquired, a sphere with said radius is constructed around the respective k-space point, then also the k-space points at positions at which no data are acquired also lie within at least one of said spheres, and to calculate the aperture of the at least one receiving antenna dependent on said radius; and
an output interface at which said processor provides an electronic representation of the calculated aperture.

21. A computer as claimed in claim 20 wherein said processor is configured, starting from a set of receiving antennae, to determine a receiving antenna having an aperture that is smaller than a maximum aperture and that has a smallest difference from the maximum aperture within said set of receiving antennae.

22. A non-transitory, computer-readable data storage medium encoded with programming instructions, said storage medium being loaded into a computer system of a magnetic resonance (MR) apparatus comprising an MR data acquisition scanner for executing an imaging sequence, having a plurality of receiving antennae, said programming instructions causing said computer system to:
operate the data acquisition scanner to acquire MR data with a plurality of receiving antennae of the data acquisition scanner and entering the acquired MR data into a memory organized as k-space comprising a plurality of k-space points, with the acquired MR data being entered into k-space at respective positions of particular k-space points with a number of said particular k-space points being smaller than a number of all k-space points belonging to the imaging sequence;
configure an aperture of each of the receiving antennae to cause data to be acquired at a respective k-space point, with a spectral main lobe of each receiving antenna also extending over k-space points that are adjacent to the respective k-space point; and
reconstruct all image points that correspond to all of said k-space points, using respective sensitivity profiles of the receiving antennae to thereby take account of data from k-space points at positions at which no MR data were acquired.

* * * * *